United States Patent
Mizuno et al.

(10) Patent No.: US 9,818,673 B2
(45) Date of Patent: Nov. 14, 2017

(54) COOLER

(71) Applicant: DENSO CORPORATION, Kariya-city, Aichi-pref. (JP)

(72) Inventors: Yasuhiro Mizuno, Kariya (JP); Tomohiro Shimazu, Kariya (JP); Yuki Suzuki, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 85 days.

(21) Appl. No.: 14/914,081

(22) PCT Filed: Aug. 25, 2014

(86) PCT No.: PCT/JP2014/004351
§ 371 (c)(1),
(2) Date: Feb. 24, 2016

(87) PCT Pub. No.: WO2015/029411
PCT Pub. Date: Mar. 5, 2015

(65) Prior Publication Data
US 2016/0211192 A1 Jul. 21, 2016

(30) Foreign Application Priority Data

Aug. 30, 2013 (JP) .................................. 2013-179332

(51) Int. Cl.
*H05K 7/20* (2006.01)
*F28D 1/03* (2006.01)
(Continued)

(52) U.S. Cl.
CPC ............ *H01L 23/473* (2013.01); *F28F 3/025* (2013.01); *F28F 3/086* (2013.01);
(Continued)

(58) Field of Classification Search
CPC ......... F28D 1/0325; F28F 3/025; F28F 3/086; H05K 7/20254; H01L 23/473
(Continued)

(56) References Cited

U.S. PATENT DOCUMENTS 3,473,210 A * 10/1969 Klank ...................... F28F 3/025
29/281.1
5,517,757 A * 5/1996 Hayashi ................ F28D 1/0341
165/153

(Continued)

FOREIGN PATENT DOCUMENTS

EP          2161528 A2 * 3/2010
JP          2005191527 A    7/2005
(Continued)

OTHER PUBLICATIONS

International Search Report and Written Opinion (in Japanese with English Translation) for PCT/JP2014/004351, dated Nov. 18, 2014; ISA/JP.

*Primary Examiner* — Leonard R Leo
(74) *Attorney, Agent, or Firm* — Harness, Dickey & Pierce, P.L.C.

(57) ABSTRACT

A cooler includes a cooling pipe having a cooling surface in contact with a heat-exchanged component, and a refrigerant passage. A pair of outer passages are formed between a pair of opposed inner wall surfaces which are located at both ends of an inner wall surface of the cooling pipe in a perpendicular direction and which constitute the refrigerant passage, and a pair of partition walls that are located at both ends of an inner fin in the perpendicular direction. At least one flow-regulating rib is formed in the refrigerant passage to project into the refrigerant passage at a position inward of the pair of outer passages in the perpendicular direction and at a position outward of an inflow hole and a discharge hole in the perpendicular direction as well as at a position
(Continued)

outward of the inner fin in an arrangement direction and at a position inward of the inflow hole and the discharge hole in the arrangement direction. The flow-regulating rib is configured to restrict flow rates of refrigerant through the pair of outer passages.

5 Claims, 12 Drawing Sheets

(51) Int. Cl.
    *F28F 3/06*         (2006.01)
    *H01L 23/473*     (2006.01)
    *F28F 3/02*         (2006.01)
    *F28F 3/08*         (2006.01)
    *H01L 23/367*     (2006.01)
    *H01L 25/07*      (2006.01)
    *H01L 25/11*      (2006.01)
    *F28F 9/22*         (2006.01)

(52) U.S. Cl.
    CPC ........ *H01L 23/3675* (2013.01); *H01L 25/074* (2013.01); *H01L 25/117* (2013.01); *H05K 7/20927* (2013.01); *F28D 1/0325* (2013.01); *F28F 2009/224* (2013.01); *H01L 23/3672* (2013.01); *H01L 2924/0002* (2013.01); *H05K 7/20254* (2013.01)

(58) Field of Classification Search
    USPC .................. 165/153, 170, 80.4; 361/699
    See application file for complete search history.

(56) References Cited

U.S. PATENT DOCUMENTS

| | | | | |
|---|---|---|---|---|
| 6,302,195 | B1 * | 10/2001 | Kataoka | F28F 3/025 165/134.1 |
| 7,571,759 | B2 * | 8/2009 | Inagaki | F28D 1/0325 165/80.4 |
| 2005/0121173 | A1 | 6/2005 | Inagaki et al. | |
| 2006/0219396 | A1 * | 10/2006 | Abei | H01L 23/473 165/164 |
| 2011/0284197 | A1 | 11/2011 | Sugimoto | |

FOREIGN PATENT DOCUMENTS

| | | | | |
|---|---|---|---|---|
| JP | 2007051804 | A | * | 3/2007 |
| JP | 2008004667 | A | | 1/2008 |
| JP | 2008106969 | A | * | 5/2008 |
| JP | 2009182313 | A | | 8/2009 |
| JP | 2010010418 | A | | 1/2010 |
| JP | 2011228580 | A | | 11/2011 |
| JP | 2012009826 | A | | 1/2012 |

* cited by examiner

FIG. 5A
FIG. 5B
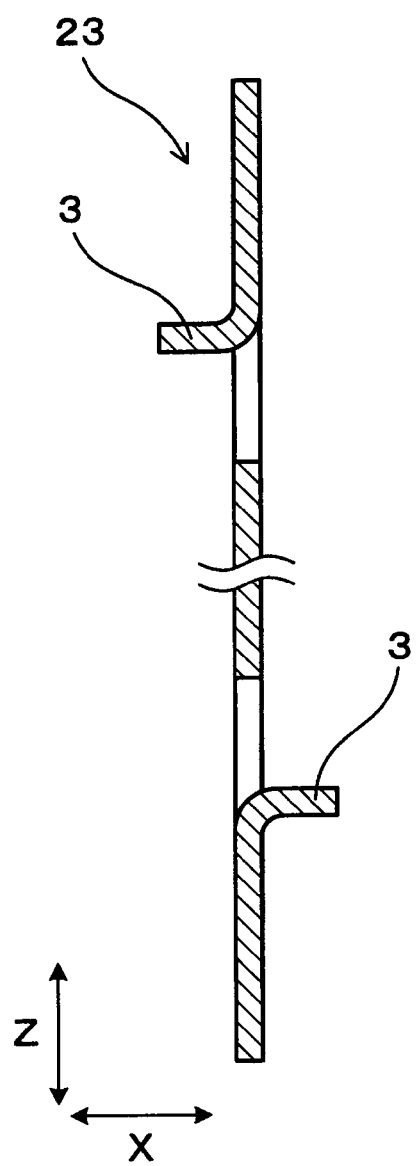
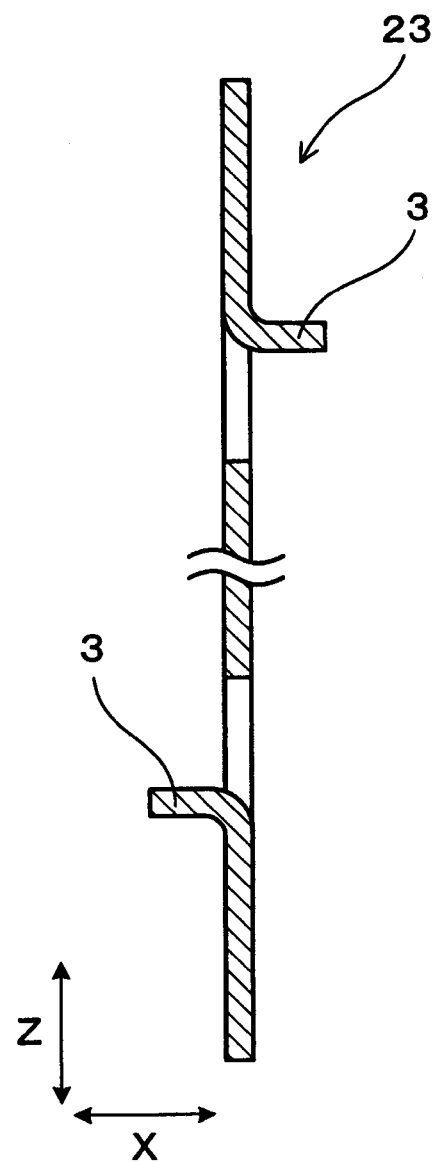

COOLER

CROSS REFERENCE TO RELATED APPLICATIONS

This application is a U.S. National Phase Application under 35 U.S.C. 371 of International Application No. PCT/JP2014/004351 filed on Aug. 25, 2014 and published in Japanese as WO 2015/029411 A1 on Mar. 5, 2015. This application is based on and claims the benefit of priority from Japanese Patent Application No. 2013-179332 filed on Aug. 30, 2013. The entire disclosures of all of the above applications are incorporated herein by reference.

TECHNICAL FIELD

The present disclosure relates to a cooler.

BACKGROUND ART

A power converter including a semiconductor module integrating a semiconductor device such as a switching element is used for a hybrid car or electric automobile. This power converter includes a cooler for cooling the heat-generating semiconductor module. There is a cooler described in, for example, Patent Document 1 as the cooler employed for the power converter.

The cooler in Patent Document 1 includes a cooling pipe having a refrigerant passage through which refrigerant circulates, and an inner fin disposed in the refrigerant passage. A plate material made of metal is pressed to form the inner fin, and the inner fin includes partition walls. Arranging the inner fin in the refrigerant passage forms fine passages obtained by dividing the refrigerant passage into several passages.

PRIOR ART DOCUMENT

Patent Document

Patent Document 1: JP2005-191527A

However, the cooler described in Patent Document 1 has the following issue. In the cooler in Patent Document 1, an outer passage having a larger cross-sectional area and a smaller pressure loss than the fine passage is formed between the end part of the inner fin and the inner wall surface of the refrigerant passage. Thus, the refrigerant flowing in the refrigerant passage easily flows into the outer passage having a smaller pressure loss. Therefore, the flow rate of refrigerant in the fine passage decreases, so that the cooling efficiency of the cooler is reduced.

SUMMARY OF INVENTION

The present disclosure addresses the above issues. Thus, it is an objective of the present disclosure to provide a cooler that can improve cooling efficiency to effectively cool a heat-exchanged component.

A cooler in an aspect of the present disclosure includes a cooling pipe having a cooling surface in contact with a heat-exchanged component, a refrigerant passage through which refrigerant flows, an inflow hole through which refrigerant flows into the refrigerant passage, a discharge hole through which refrigerant is discharged from the refrigerant passage, an inner fin that is disposed between the inflow hole and the discharge hole in the refrigerant passage and includes a plurality of partition walls dividing the refrigerant passage into a plurality of fine passages in a perpendicular direction perpendicular both to an arrangement direction in which the inflow hole and the discharge hole are arranged, and to a normal direction which is normal to the cooling surface, an inner wall surface that defines the refrigerant passage and includes a pair of opposed inner wall surfaces which are located at both ends of the inner wall surface in the perpendicular direction and which constitute the refrigerant passage, a pair of outer passages that are formed between the pair of opposed inner wall surfaces and a pair of partition walls of the plurality of partition walls that are located at both ends of the inner fin in the perpendicular direction, and a flow-regulating rib that is formed in the refrigerant passage to project into the refrigerant passage at a position inward of the pair of outer passages in the perpendicular direction and at a position outward of the inflow hole and the discharge hole in the perpendicular direction as well as at a position outward of the inner fin in the arrangement direction and at a position inward of the inflow hole and the discharge hole in the arrangement direction. The flow-regulating rib is configured to restrict flow rates of refrigerant through the pair of outer passages.

The cooler includes the flow-regulating rib in the refrigerant passage, and is configured to limit the flow rate of refrigerant in the pair of outer passages. Accordingly, cooling performance of the cooler can be improved.

Specifically, the refrigerant flowing in the refrigerant passage has its flow regulated by the flow-regulating rib to be guided toward the center of the refrigerant passage in the perpendicular direction. Furthermore, forming the flow-regulating rib reduces the passage cross section of the refrigerant passage between the inflow hole and the discharge hole, and the outer passages. Accordingly, the pressure loss when refrigerant flows into the outer passage can be increased to reduce the flow rate of refrigerant through the outer passage.

Consequently, the flow rates of refrigerant through the fine passages divided by the inner fin can be increased to decrease the flow rate of refrigerant in the outer passage. As a result, the cooler can flow more refrigerant through the fine passages divided by the inner fin having high heat exchanging performance to efficiently cool the heat-exchanged component As described above, the cooler can improve the cooling efficiency to effectively cool the heat-exchanged component.

BRIEF DESCRIPTION OF DRAWINGS

The above and other objects, features and advantages of the present disclosure will become more apparent from the following detailed description made with reference to the accompanying drawings. In the drawings:

FIG. 5A is a cross-sectional view taken along a line Va-Va and viewed from arrows Va in FIG. 4; FIG. 5B is a cross-sectional view taken along a line Vb-Vb and viewed from arrows Vb in FIG. 4;

EMBODIMENTS FOR CARRYING OUT INVENTION

In the above-described cooler, one end of the flow-regulating rib may be located inside the fine passage. In this case, the refrigerant can flow into the fine passages more reliably to increase the flow rates of refrigerant through the fine passages. Thus, cooling efficiency of the cooler can be further improved. Moreover, the flow-regulating rib can be used for positioning the inner fin. As a consequence, position accuracy and assembling workability of the inner fin can be improved.

The flow-regulating rib may be formed on at least one of the inflow hole-side of one outer passage and the discharge hole-side of the other outer passage. In this case, the flow rate of refrigerant through both the outer passages can be restricted. Thus, the flow rate of refrigerant through the fine passage can be increased to improve the cooling performance of the cooler more reliably.

(First Embodiment)

Figure 1:
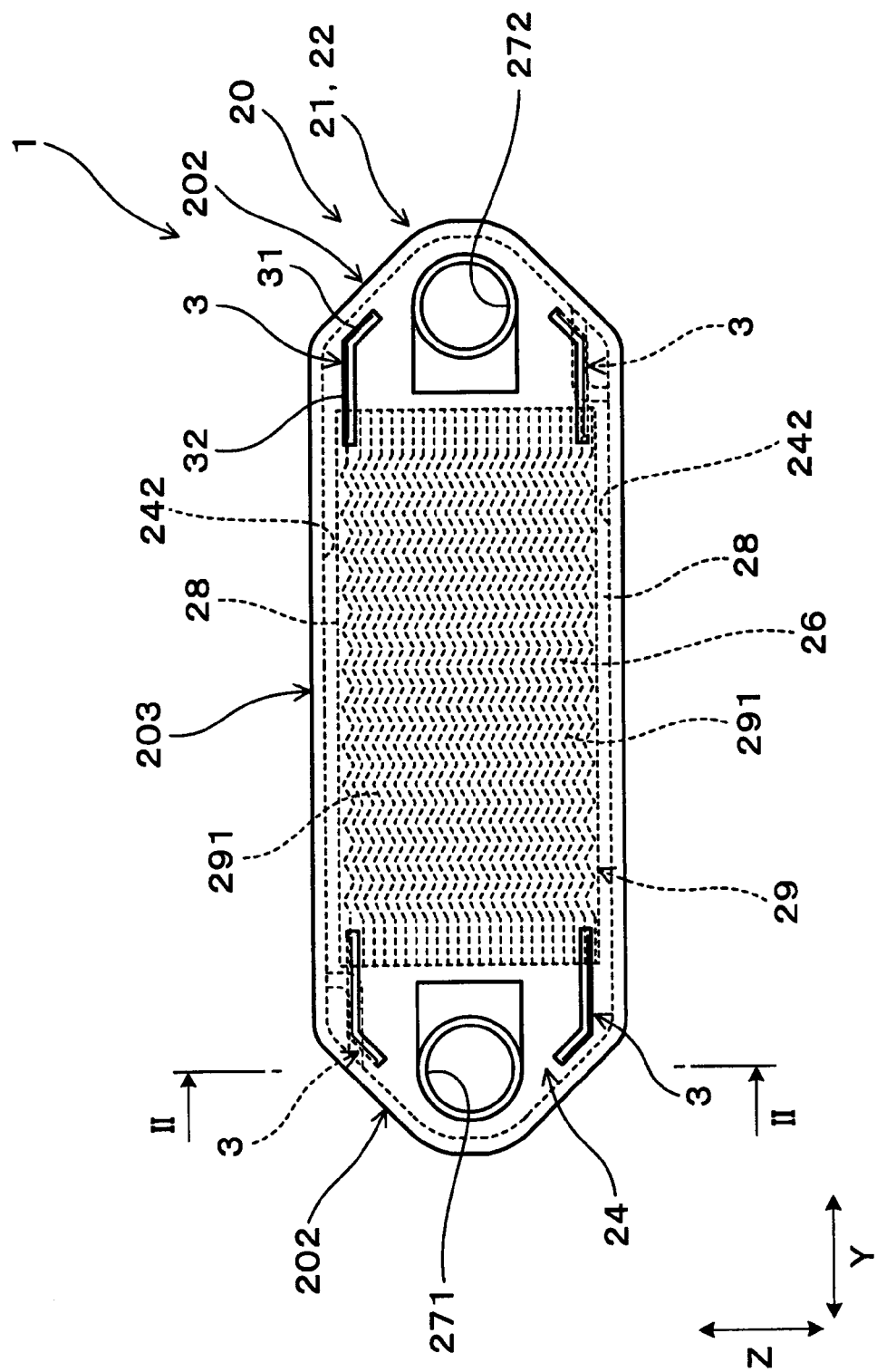
FIG. 1 is a diagram illustrating a cooler in accordance with a first embodiment.
Figure 2:
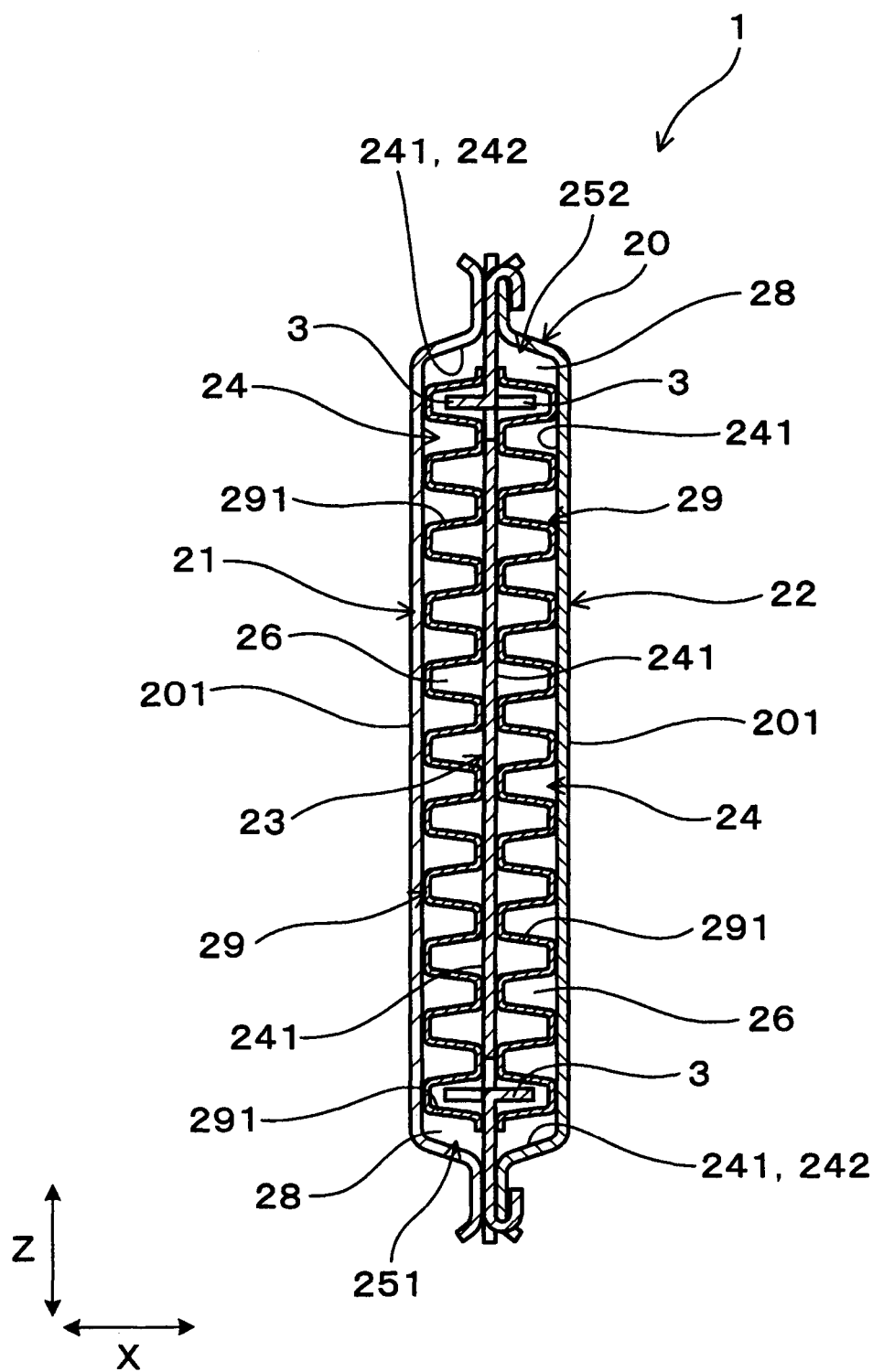
FIG. 2 is a cross-sectional view taken along a line II-II and viewed from arrows II in FIG. 1.

A cooler in a first embodiment will be described with reference to FIGS. 1 to 6. As illustrated in FIGS. 1 and 2, a cooler 1 includes a cooling surface 201 in contact with a semiconductor module 5 (FIG. 6) serving as a heat-exchanged component, and a cooling pipe 20 provided with a refrigerant passage 24 through which refrigerant flows. The cooling pipe 20 includes an inflow hole 271 through which refrigerant flows into the refrigerant passage 24, a discharge hole 272 through which refrigerant is discharged from the refrigerant passage 24, and an inner fin 29 disposed between the inflow hole 271 and the discharge hole 272 in the refrigerant passage 24.

The inner fin 29 includes partition walls 291 that divide the refrigerant passage 24 into fine passages 26 in a perpendicular direction Z that is perpendicular both to an arrangement direction Y in which the inflow hole 271 and the discharge hole 272 are arranged, and to a normal direction X which is normal to the cooling surface 201. In the perpendicular direction Z, a pair of outer passages 28 are formed between a pair of opposed inner wall surfaces 242 constituting the refrigerant passages 24 arranged at both ends of an inner wall surface 241 of the cooling pipe 20 that defines the refrigerant passage 24, and a pair of partition walls 291 arranged at both ends of the inner fin 29.

A flow-regulating rib 3 projecting into the refrigerant passage 24 is formed in the refrigerant passage 24. The flow-regulating ribs 3 are formed at the positions inward of the pair of outer passages 28 and at the positions outward of the inflow hole 271 and the discharge hole 272 in the perpendicular direction Z, as well as at the positions outward of the inner fin 29 and at the positions inward of the inflow hole 271 and the discharge hole 272 in the arrangement direction Y. The cooler 1 is configured to limit the flow rates of refrigerant in the pair of outer passages 28 by the flow-regulating ribs 3.

Figure 6:
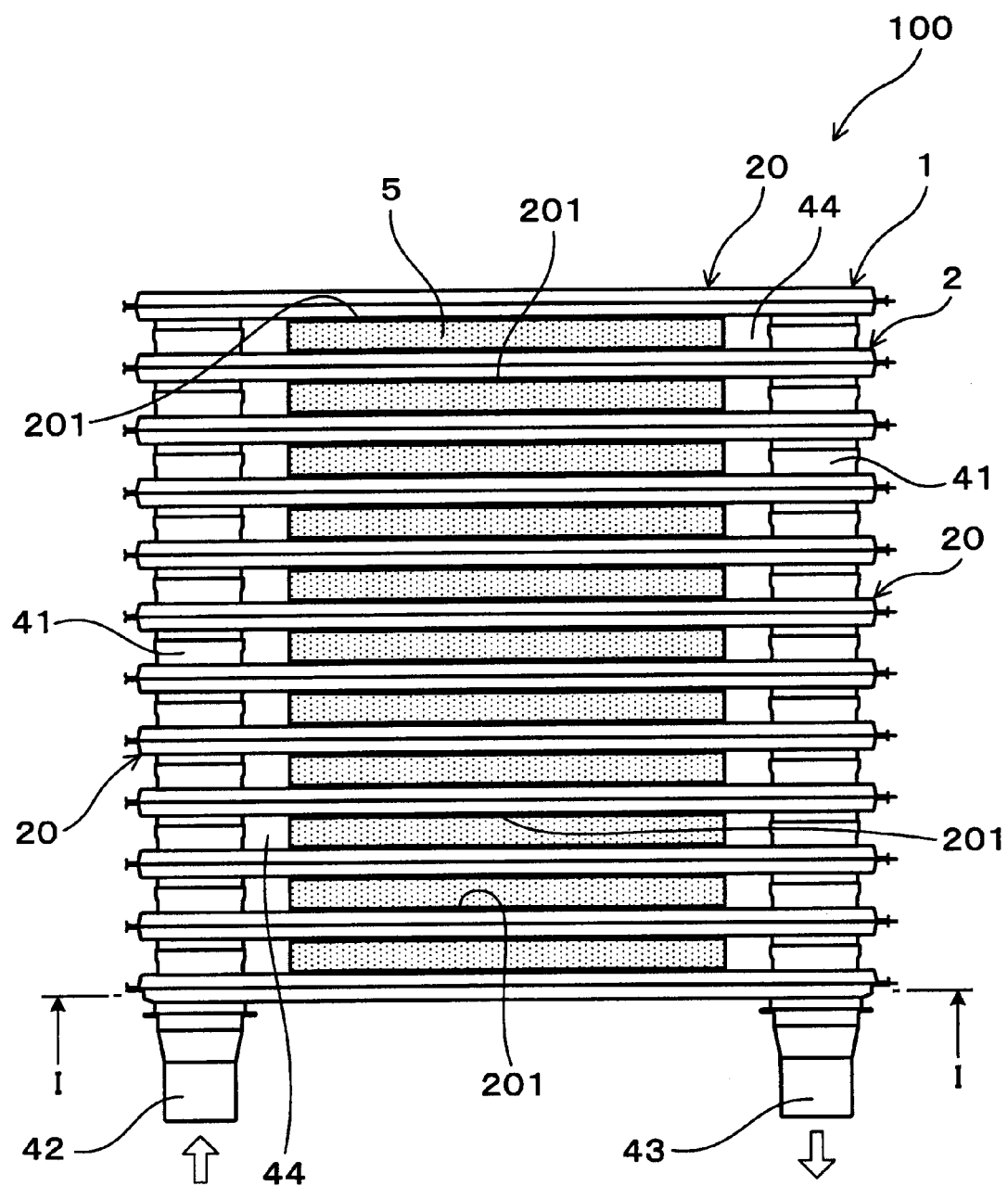
FIG. 6 is a diagram illustrating a semiconductor unit of the first embodiment.

More detailed explanation will be given below. As illustrated in FIG. 6, the cooler 1 of the present embodiment is for cooling the semiconductor modules 5 in a power converter. The power converter includes a semiconductor unit 100 having the cooler 1 and the semiconductor modules 5, and a case (not shown) accommodating this unit.

As illustrated in FIGS. 1 and 2, the semiconductor modules 5 constituting the semiconductor unit 100 integrate switching elements, and include control terminals (not shown) extending toward one side in the perpendicular direction Z, and main electrode terminals extending toward an opposite side from the control terminals. The semiconductor module 5 integrates a switching element such as an insulated gate bipolar transistor (IGBT) or an MOS type field effect transistor (MOSFET).

As illustrated in FIG. 6, the cooler 1 which cools the semiconductor modules 5 includes a heat exchange part 2 obtained by arranging the cooling pipes 20 side by side, a refrigerant introducing pipe 42 introducing refrigerant into the refrigerant passage 24, and a refrigerant discharge pipe 43 discharging refrigerant from the refrigerant passage 24.

Each of the refrigerant introducing pipe 42 and the refrigerant discharge pipe 43 is formed integrally with the cooling pipe 20 that is disposed at a front end of the cooler 1, and extends out toward the front side. Each of the refrigerant introducing pipe 42 and the refrigerant discharge pipe 43 is arranged generally coaxially with a connecting pipe 41 near both end parts in the arrangement direction Y.

As illustrated in FIGS. 1 and 2, each of the cooling pipes 20 constituting the heat exchange part 2 include the cooling surface 201 in contact with the semiconductor module 5, and the refrigerant passage 24 through which refrigerant flows. As illustrated in FIG. 6, the adjacent cooling pipes 20 are connected together by the connecting pipe 41 such that their cooling surfaces 201 are opposed to each other, and are arranged side by side to form an arrangement space 44 therebetween for disposing the semiconductor module 5.

As illustrated in FIGS. 1 and 2, the cooling pipe 20 in the present embodiment includes a pair of tapered parts 202 that are formed to increase their respective widths from both ends in the arrangement direction Y toward the inside of the cooling pipe 20, and a rectangle-shaped central part 203 located between the pair of tapered parts 202, when viewed from the normal direction X.

The cooling pipe 20 includes a front outer shell plate 21 located on its front side, a rear outer shell plate 22 located on its rear side, an intermediate plate 23 disposed between the front outer shell plate 21 and the rear outer shell plate 22, and the inner fin 29 disposed in the refrigerant passage 24.

The front outer shell plate 21 and the rear outer shell plate 22 are configured such that by joining the plates 21, 22 together, the inner wall surfaces 241 of the front outer shell plate 21 and the rear outer shell plate 22 define a space serving as the refrigerant passage 24. The refrigerant passage 24 is divided into two parts in the normal direction X with the intermediate plate 23, and a first divided passage 251 and a second divided passage 252 as a divided passage are thereby formed.

As illustrated in FIG. 1, the front outer shell plate 21 and the rear outer shell plate 22 which constitute the cooling pipe 20 include through holes communicating with the refrigerant introducing pipe 42, the refrigerant discharge pipe 43, and the connecting pipe 41. The hole of the through holes that is located on the refrigerant introducing pipe 42-side in the arrangement direction Y is referred to as the inflow hole 271, and the hole of the through holes that is located on the refrigerant discharge pipe 43-side in the arrangement direction Y is referred to as the discharge hole 272.

As illustrated in FIG. 2, one inner fin 29 is provided in each of the first divided passage 251 and the second divided passage 252, and the cross-sectional shape of the inner fin 29 perpendicular to the arrangement direction Y is a continuously recessed and projecting shape. The inner fins 29 which are adjacent to each other in a stacking direction have their respective crest part and trough part arranged at the same position in the arrangement direction Y. Thus, the inner fins 29 have opposite phasic shapes from each other.

Figure 3:
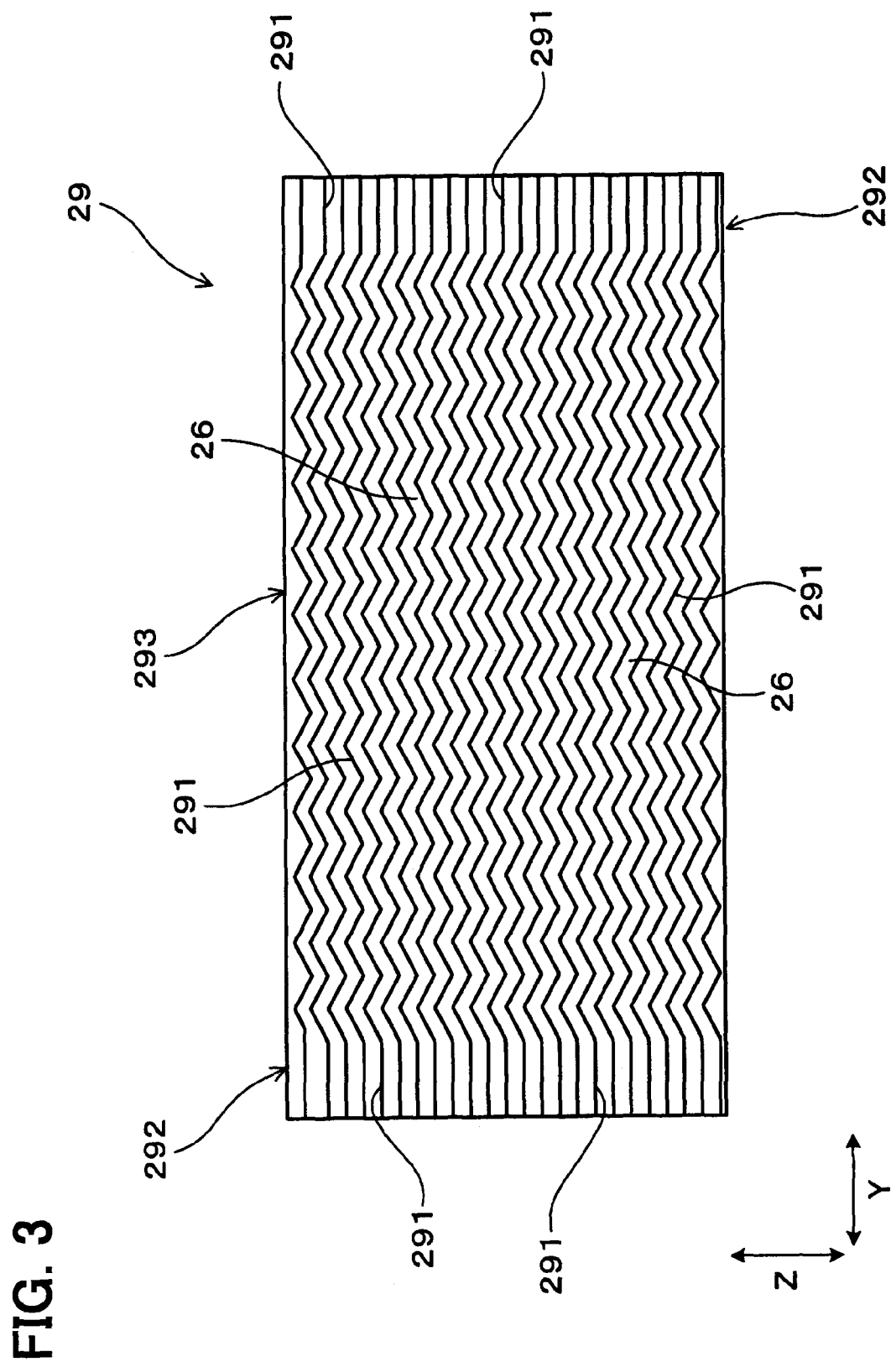
FIG. 3 is a plan view illustrating an inner fin of the first embodiment.

As illustrated in FIG. 3, when viewed from the normal direction X, a pair of straight fin parts 292 having the partition walls 291 which are formed to extend straight in the arrangement direction Y are formed at both ends of the inner fin 29 in the arrangement direction Y. Moreover, a wavy fin part 293 having the partition wall 291 which is formed to have a corrugated shape when viewed from the normal direction X is formed inward of the pair of straight fin parts 292 in the arrangement direction Y. The inner fin 29 divides the refrigerant passage 24 by the partition walls 291 between the fine passages 26 which are arranged in the perpendicular direction Z.

Figure 4:
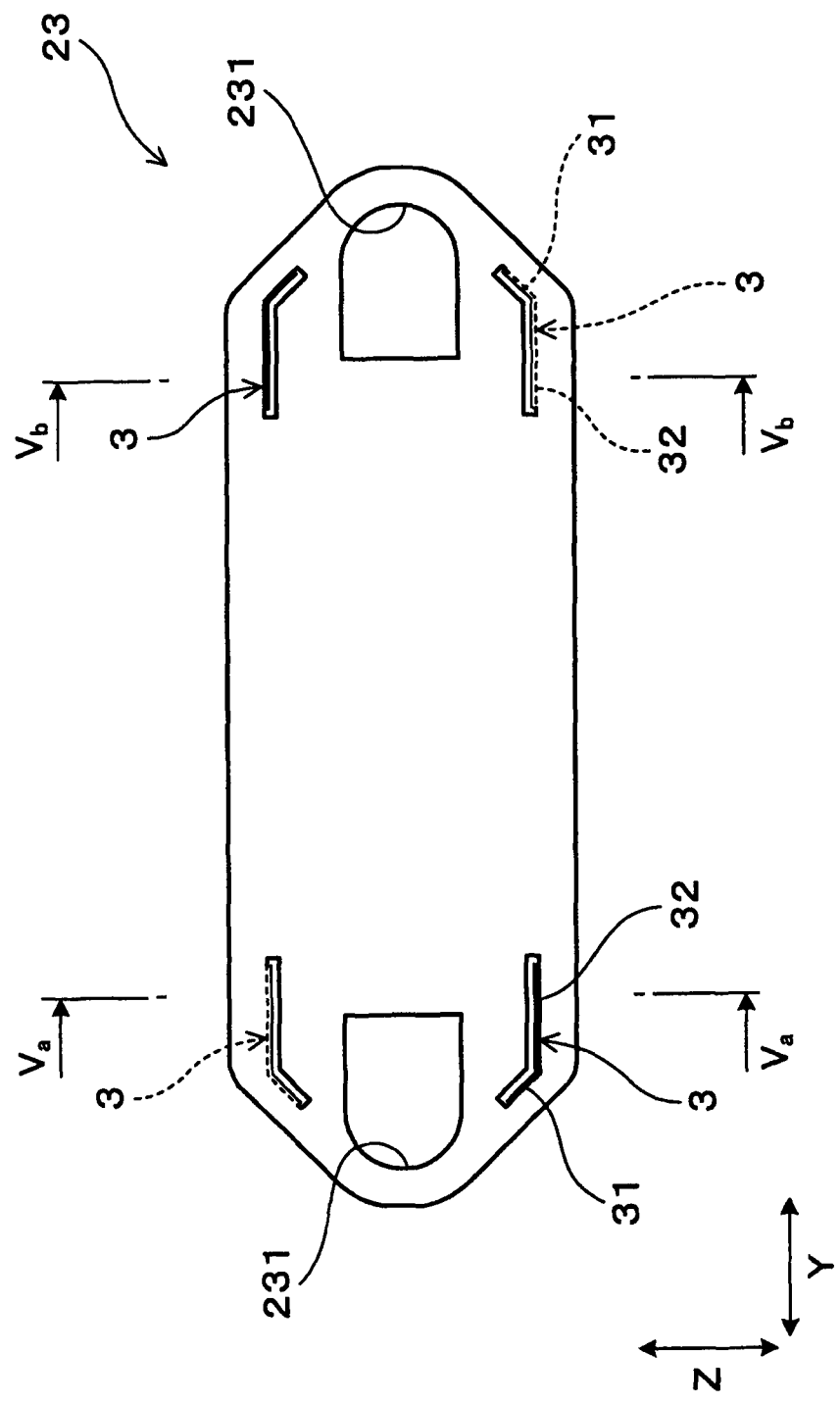
FIG. 4 is a plan view illustrating an intermediate plate of the first embodiment.

As illustrated in FIG. 2, the pair of outer passages 28 are formed between the pair of opposed inner wall surfaces 242 constituting the refrigerant passage 24 located at both ends in the perpendicular direction Z, and the pair of partition walls 291 of the inner fin 29 located at both ends in the perpendicular direction As illustrated in FIGS. 4 to 5B, the intermediate plate 23 has generally the same shape as the front outer shell plate 21 and the rear outer shell plate 22 when viewed from the normal direction X, and is clamped between the plates 21, 22 to divide the refrigerant passage 24 into two parts, thus configuring the inner wall surfaces 241 of the first divided passage 251 and the second divided passage 252. The intermediate plate 23 includes a pair of flow holes 231 which are formed to pass through the plate 23 coaxially with the connecting pipe 41, the refrigerant introducing pipe 42, and the refrigerant discharge pipe 43, and the flow-regulating ribs 3 projecting into the first divided passage 251 and the second divided passage 252.

As illustrated in FIGS. 1 and 2, the flow-regulating ribs 3 are formed at the positions inward of the pair of outer passages 28 and at the positions outward of the inflow hole 271 and the discharge hole 272 in the perpendicular direction Z, as well as at the positions outward of the inner fin 29 and at the positions inward of the inflow hole 271 and the discharge hole 272 in the arrangement direction Y. As illustrated in FIGS. 4 to 5B, the flow-regulating rib 3 in the present embodiment is formed by cutting and raising work performed on the intermediate plate 23. The flow-regulating ribs 3 are arranged on the inflow hole 271-side of the outer passage 28 of the pair of outer passages 28 of the first divided passage 251 located on one side in the perpendicular direction Z and on the discharge hole 272-side of the outer passage 28 of the pair of outer passages 28 of the first divided passage 251 located on the other side in the perpendicular direction Z. In addition, the flow-regulating ribs 3 are arranged on the discharge hole 272-side of the outer passage 28 of the pair of outer passages 28 of the second divided passage 252 located on one side in the perpendicular direction Z and on the inflow hole 271-side of the outer passage 28 of the pair of outer passages 28 of the second divided passage 252 located on the other side in the perpendicular direction Z.

As illustrated in FIGS. 1 and 4, when viewed from the normal direction X, the flow-regulating rib 3 includes an inclined rib part 31 that is formed along the outer shape of the tapered part 202, and a linear rib part 32 that extends inwardly along the arrangement direction Y from the end portion of the inclined rib part 31 located inward in the arrangement direction Y. The end portion of the linear rib part 32 inward in the arrangement direction Y is disposed inside the fine passage 26 formed by the straight fin parts 292 of the inner fin 29.

The operation and effects of the present embodiment will be described below. The cooler 1 includes the above-formed flow-regulating rib 3 in the refrigerant passage 24, and is configured to thereby restrict the flow rate of refrigerant through the pair of outer passages 28. Thus, cooling performance of the cooler 1 can be improved.

Specifically, the refrigerant flowing in the refrigerant passage 24 has its flow regulated by the flow-regulating rib 3 to be guided toward the center of the refrigerant passage 24 in the perpendicular direction Z. Furthermore, forming the flow-regulating ribs 3 reduces the passage cross section of the refrigerant passage 24 between the inflow hole 271 and the discharge hole 272, and the outer passages 28. Accordingly, the pressure loss when refrigerant flows into the outer passage 28 can be increased to reduce the flow rate of refrigerant through the outer passage 28.

Consequently, the flow rates of refrigerant through the fine passages 26 divided by the inner fin 29 can be increased to decrease the flow rate of refrigerant in the outer passage 28. As a result, the cooler 1 can flow more refrigerant through the fine passages 26 divided by the inner fin 29 having high heat exchanging performance to efficiently cool the semiconductor module 5.

One end of the flow-regulating rib 3 is disposed inside the fine passage 26. Accordingly, the refrigerant can flow into the fine passage 26 more reliably to increase the flow rate of refrigerant through the fine passage 26. Thus, cooling efficiency of the cooler 1 can be further improved. Moreover, the flow-regulating rib 3 can be used for positioning the inner fin 29. As a consequence, position accuracy and assembling workability of the inner fin 29 can be improved.

The flow-regulating rib 3 is formed on at least one of the inflow hole 271-side in the outer passage 28 and the discharge hole 272-side in the outer passage 28. Accordingly, the flow rate of refrigerant through both the outer passages 28 can be restricted. Thus, the flow rates of refrigerant through the fine passages 26 can be increased to improve the cooling performance of the cooler 1 more reliably.

The cooling pipe 20 includes the intermediate plate 23 which divides the refrigerant passage 24 in the normal direction X which is normal to the cooling surface 201. The inner fin 29 is disposed in each of the divided passages divided by the intermediate plate 23, and the flow-regulating ribs 3 are provided for the intermediate plate 23. Accordingly, the cooling performance of the cooler 1 can also be improved in the case of double-sided cooling with both the cooling surface 201 of the cooling pipe 20 and the surface located on an opposite side from the cooling surface 201 in the normal direction X used as the cooling surface 201.

As described above, the cooler 1 of the present embodiment can improve the cooling efficiency to effectively cool the heat-exchanged component.

(Second Embodiment)

Figure 7:
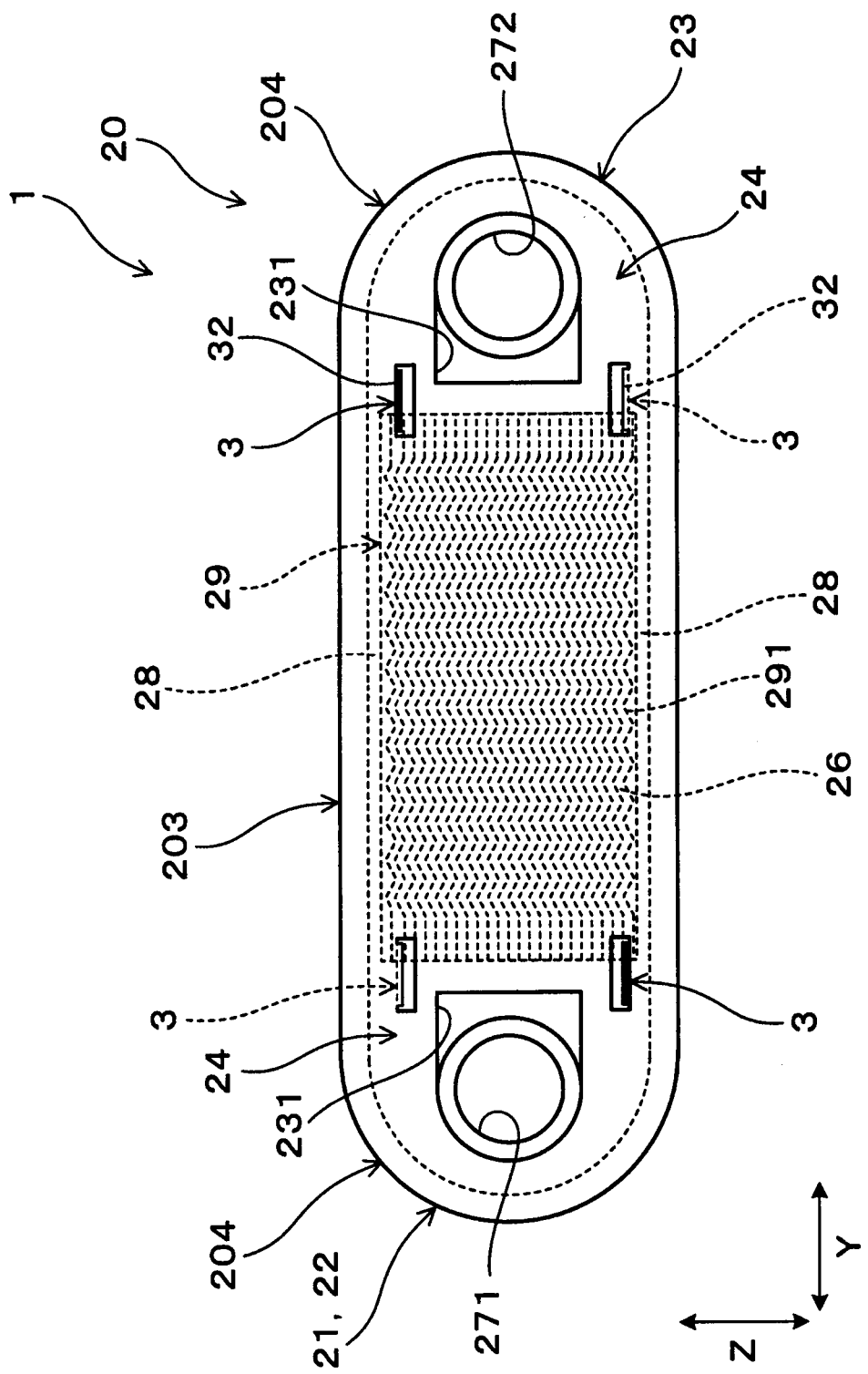
FIG. 7 is a diagram illustrating a cooler in accordance with a second embodiment.

As illustrated in FIG. 7, the present embodiment is a partial modification to the configuration of the cooler 1 of the first embodiment. A cooling pipe 20 of a cooler 1 of the present embodiment includes a pair of semicircular parts 204 having a generally semicircular shape formed respectively at both ends in the arrangement direction Y, and a generally rectangle-shaped central part 203 located between the pair of semicircular parts 204, when viewed from the normal direction X. A flow-regulating rib 3 which is formed on an intermediate plate 23 includes a linear rib part 32 that is formed along the arrangement direction Y.

In addition, out of the reference numerals used in the present embodiment or in the drawing relevant to the present embodiment, the same reference numeral as the reference numeral used in the first embodiment represents a similar component or the like to the first embodiment, unless otherwise indicated. The present embodiment can also achieve operation and effects similar to the first embodiment.

(Third Embodiment)

Figure 8:
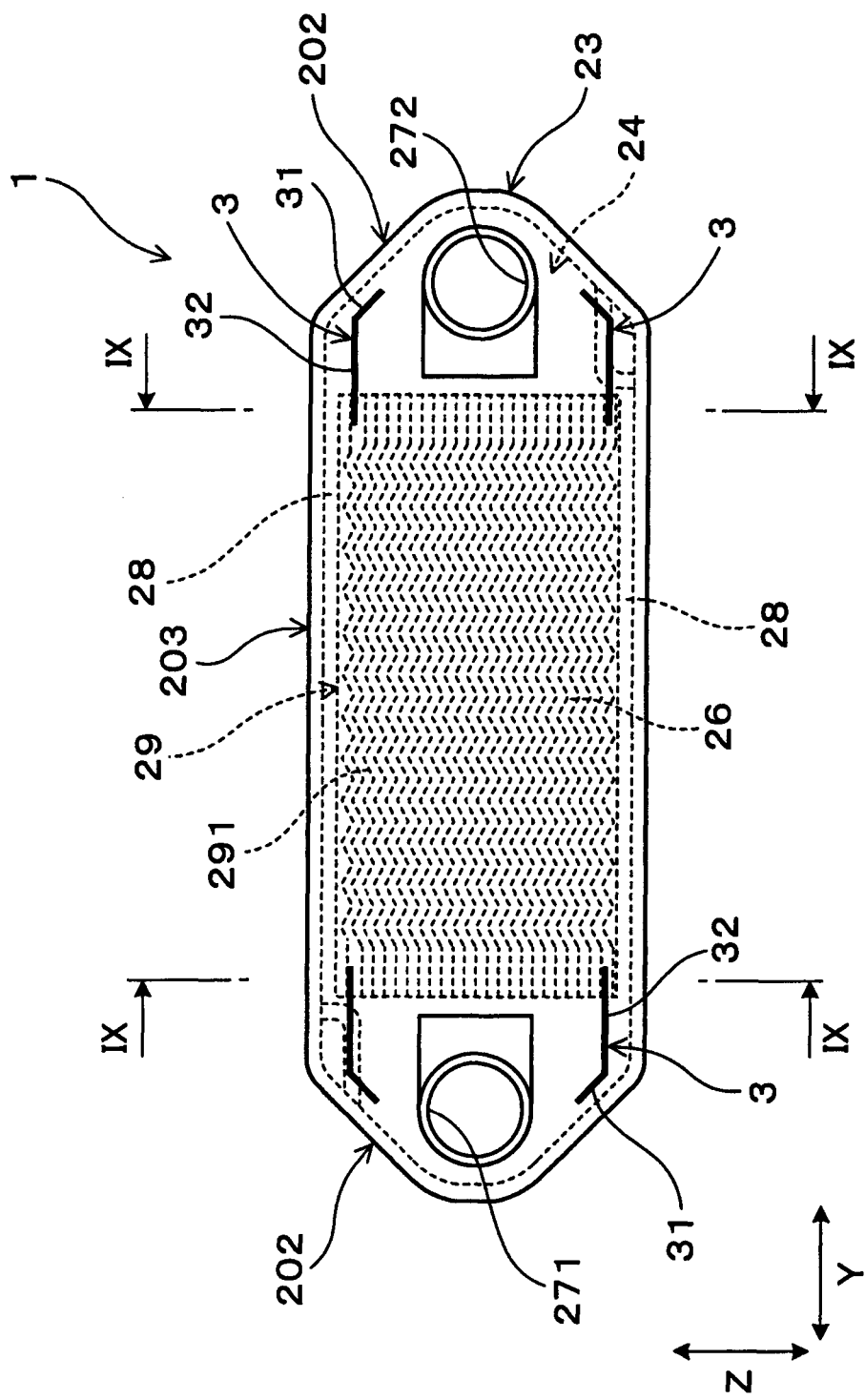
FIG. 8 is a diagram illustrating a cooler in accordance with a third embodiment.
Figure 9:
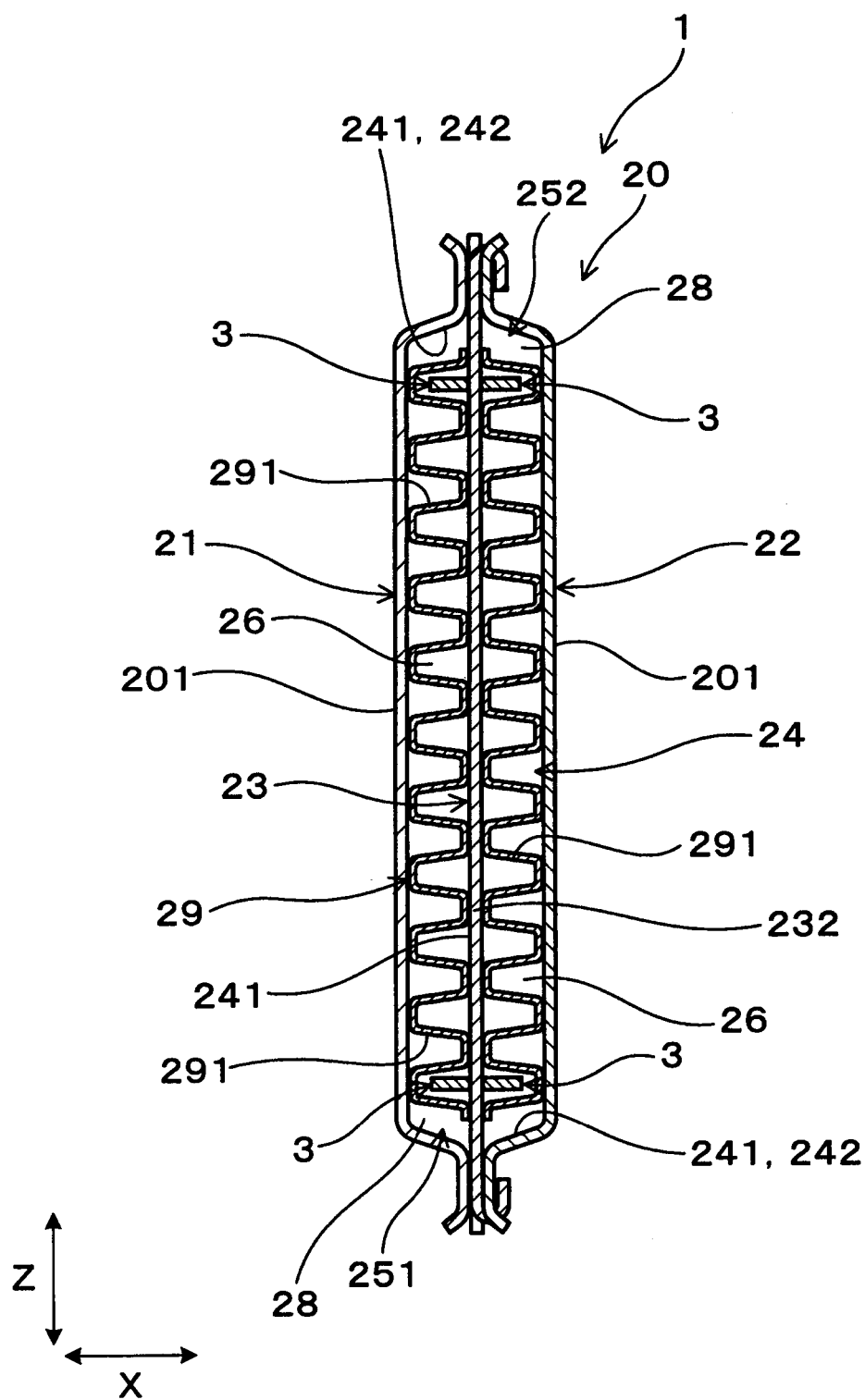
FIG. 9 is a cross-sectional view taken along a line IX-IX and viewed from arrows IX in FIG. 8.

As illustrated in FIGS. 8 and 9, the present embodiment is a modification to the configuration of the intermediate plate 23 of the cooler 1 in the first embodiment. An intermediate plate 23 of a cooler 1 of the present embodiment is formed by joining together an intermediate plate main body 232 which divides a refrigerant passage 24, and a flow-regulating rib 3 which is formed as a separate member from the intermediate plate 23. One flow-regulating rib 3 is provided on each of an inflow hole 271-side and a discharge hole 272-side in outer passages 28.

In addition, out of the reference numerals used in the present embodiment or in the drawings relevant to the present embodiment, the same reference numeral as the reference numeral used in the first embodiment represents a similar component or the like to the first embodiment, unless otherwise indicated. The present embodiment can also achieve operation and effects similar to the first embodiment.

(Fourth Embodiment)

Figure 10:
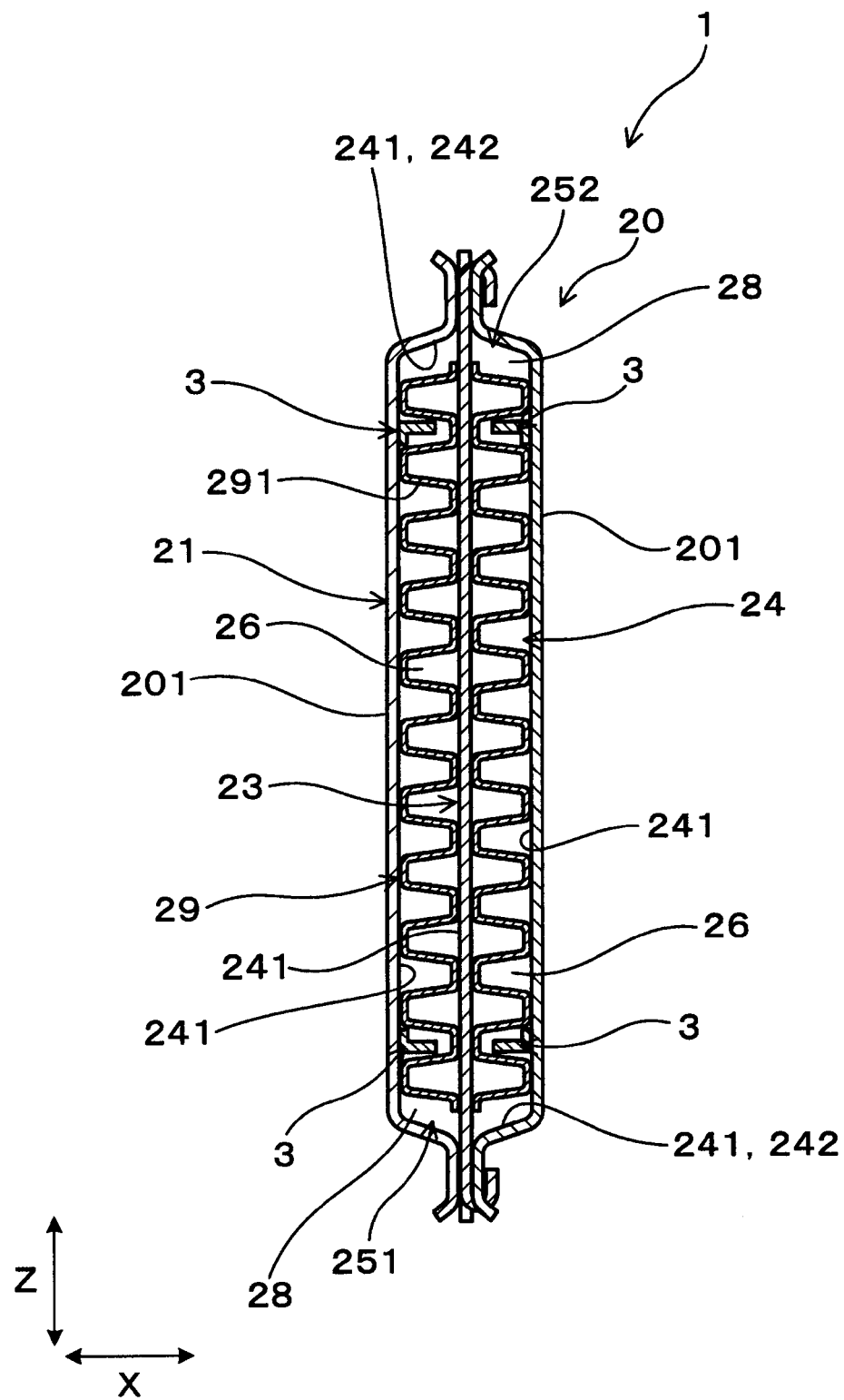
FIG. 10 is a diagram illustrating a cooler in accordance with a fourth embodiment.

As illustrated in FIG. 10, the present embodiment is a modification to the configuration of the flow-regulating rib 3 of the cooler 1 in the first embodiment. In a cooler 1 of the present embodiment, flow-regulating ribs 3 are configured such that separately-formed flow-regulating ribs 3 are joined on inner wall surfaces 241 of a front outer shell plate 21 and a rear outer shell plate 22. In addition, out of the reference numerals used in the present embodiment or in the drawing relevant to the present embodiment, the same reference numeral as the reference numeral used in the first embodiment represents a similar component or the like to the first embodiment, unless otherwise indicated. The present embodiment can also achieve operation and effects similar to the first embodiment.

(Fifth Embodiment)

Figure 11:
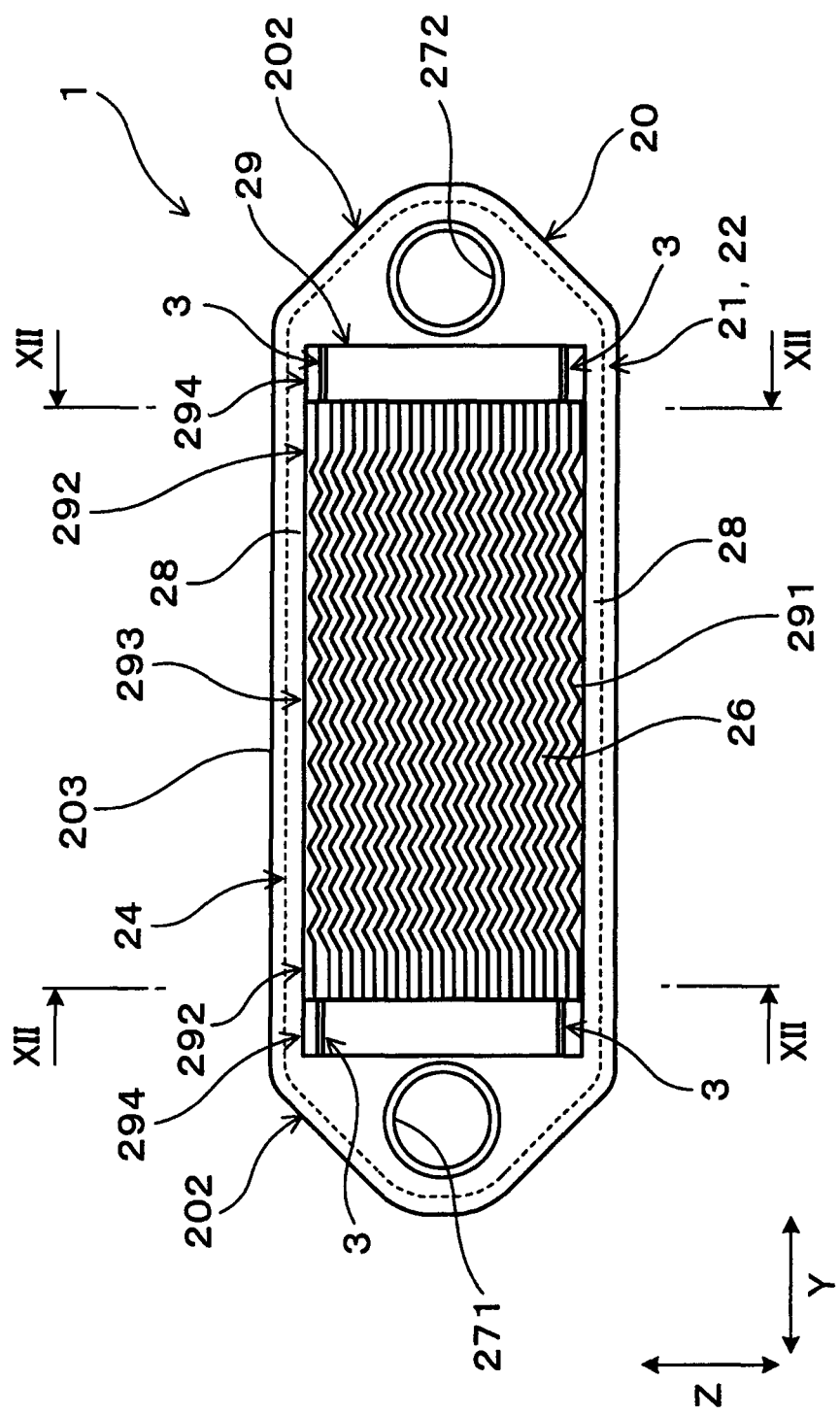
FIG. 11 is a diagram illustrating a cooler in accordance with a fifth embodiment.
Figure 12:
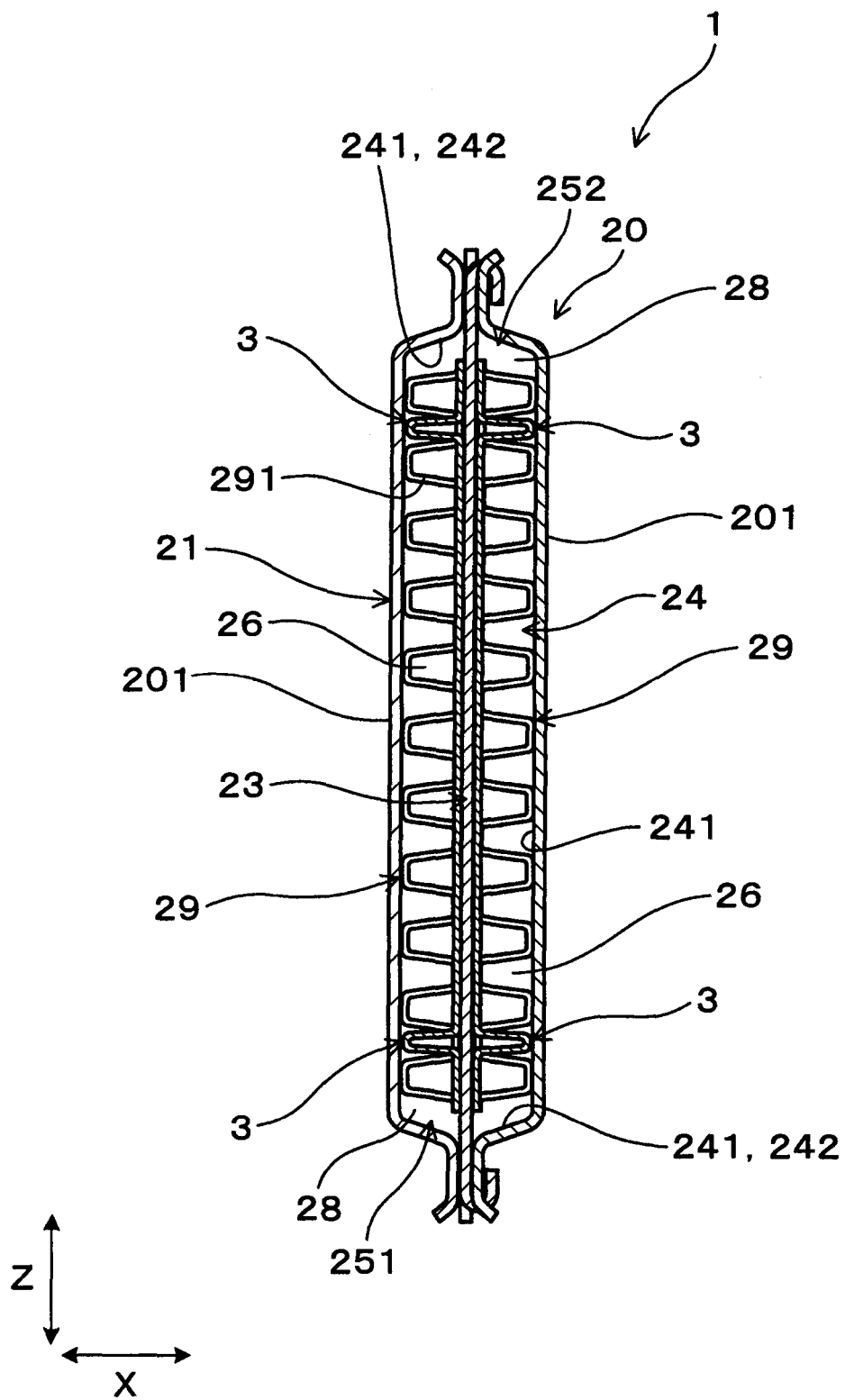
FIG. 12 is a cross-sectional view taken along a line XII-XII and viewed from arrows XII in FIG. 11.

As illustrated in FIGS. 11 and 12, the present embodiment is another modification to the configuration of the flow-regulating rib 3 of the cooler 1 in the first embodiment. In a cooler 1 of the present embodiment, a flow-regulating rib 3 is formed integrally with an inner fin 29. Similar to the first embodiment, the inner fin 29 includes a pair of straight fin parts 292, a wavy fin part 293 formed between the pair of straight fin parts 292, and a pair of rib forming parts 294 extending outwardly from both sides of the pair of straight fin parts 292 in the arrangement direction Y. The flow-regulating rib 3, with which the rib forming part 294 is integrally formed by press working, is formed to project at each of the pair of rib forming parts 294.

In addition, out of the reference numerals used in the present embodiment or in the drawings relevant to the present embodiment, the same reference numeral as the reference numeral used in the first embodiment represents a similar component or the like to the first embodiment, unless otherwise indicated. The present embodiment can also achieve operation and effects similar to the first embodiment.

Additionally, for example, the position, number and shape of the flow-regulating rib in the cooler in the above-described first embodiment to fifth embodiment illustrate examples of a part of the shapes, and the flow-regulating rib is not limited to these examples. The cooler may be formed by more than one cooling pipe or may be formed by a single cooling pipe. The refrigerant passage in each cooling pipe may be divided into more than one part or may be formed as one refrigerant passage without being divided. In any case, forming the inner fin and the flow-regulating rib in each refrigerant passage can achieve operation and effects similar to Patent Document 1.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A cooler comprising a cooling pipe that includes:
   a cooling surface in contact with a heat-exchanged component;
   a refrigerant passage through which refrigerant flows;
   an inflow hole through which refrigerant flows into the refrigerant passage;
   a discharge hole through which refrigerant is discharged from the refrigerant passage;
   an inner fin that is disposed between the inflow hole and the discharge hole in the refrigerant passage and includes a plurality of partition walls dividing the refrigerant passage into a plurality of fine passages in a perpendicular direction perpendicular both to an arrangement direction in which the inflow hole and the discharge hole are arranged, and to a normal direction which is normal to the cooling surface;
   an inner wall surface that defines the refrigerant passage and includes a pair of opposed inner wall surfaces which are located at both ends of the inner wall surface in the perpendicular direction and which constitute the refrigerant passage;
   a pair of outer passages that are formed between the pair of opposed inner wall surfaces and a pair of partition walls of the plurality of partition walls that are located at both ends of the inner fin in the perpendicular direction; and
   a flow-regulating rib that is formed in the refrigerant passage to project into the refrigerant passage at a position inward of the pair of outer passages in the perpendicular direction and at a position outward of the inflow hole and the discharge hole in the perpendicular direction as well as at a position outward of the inner fin in the arrangement direction and at a position inward of the inflow hole and the discharge hole in the arrangement direction, wherein:

the flow-regulating rib is configured to restrict flow rates of refrigerant through the pair of outer passages; and one end of the flow-regulating rib is located inside its corresponding one of the plurality of fine passages.

2. The cooler according to claim 1, wherein the flow-regulating rib is formed on at least one of the inflow hole side of one outer passage of the pair of outer passages and the discharge hole side of the other one outer passage of the pair of outer passages.

3. The cooler according to claim 1, further comprising an intermediate plate that divides the refrigerant passage into divided passages in the normal direction which is normal to the cooling surface, wherein:

the inner fin is disposed in each of the divided passages; and the flow-regulating rib is provided in the intermediate plate.

4. A cooler comprising a cooling pipe that includes:

a cooling surface in contact with a heat-exchanged component;

a refrigerant passage through which refrigerant flows;

an inflow hole through which refrigerant flows into the refrigerant passage;

a discharge hole through which refrigerant is discharged from the refrigerant passage;

an inner fin that is disposed between the inflow hole and the discharge hole in the refrigerant passage and includes a plurality of partition walls dividing the refrigerant passage into a plurality of fine passages in a perpendicular direction perpendicular both to an arrangement direction in which the inflow hole and the discharge hole are arranged, and to a normal direction which is normal to the cooling surface;

an inner wall surface that defines the refrigerant passage and includes a pair of opposed inner wall surfaces which are located at both ends of the inner wall surface in the perpendicular direction and which constitute the refrigerant passage;

a pair of outer passages that are formed between the pair of opposed inner wall surfaces and a pair of partition walls of the plurality of partition walls that are located at both ends of the inner fin in the perpendicular direction; and a flow-regulating rib that is formed in the refrigerant passage to project into the refrigerant passage at a position inward of the pair of outer passages in the perpendicular direction and at a position outward of the inflow hole and the discharge hole in the perpendicular direction as well as at a position outward of the inner fin in the arrangement direction and at a position inward of the inflow hole and the discharge hole in the arrangement direction, wherein the flow-regulating rib is configured to restrict flow rates of refrigerant through the pair of outer passages, the cooler, further comprising an intermediate plate that divides the refrigerant passage into divided passages in the normal direction which is normal to the cooling surface, wherein:

the inner fin is disposed in each of the divided passages; and the flow-regulating rib is provided in the intermediate plate.

5. The cooler according to claim 4, wherein the flow-regulating rib is formed on at least one of the inflow hole-side of one outer passage of the pair of outer passages and the discharge hole-side of the other one outer passage of the pair of outer passages.

* * * * *